(12) United States Patent
Holonyak, Jr. et al.

(10) Patent No.: US 6,753,273 B2
(45) Date of Patent: Jun. 22, 2004

(54) SEMICONDUCTOR DEVICES AND METHODS

(75) Inventors: Nick Holonyak, Jr., Urbana, IL (US); Russell Dupuis, Austin, TX (US)

(73) Assignees: The Board of Trustees of The University of Illinois, Urbana, IL (US); The Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 10/209,279

(22) Filed: Jul. 31, 2002

(65) Prior Publication Data

US 2003/0059998 A1 Mar. 27, 2003

Related U.S. Application Data

(60) Provisional application No. 60/309,149, filed on Jul. 31, 2001.

(51) Int. Cl.$^7$ .............................................. H01L 21/00
(52) U.S. Cl. ........................... 438/962; 438/45; 438/604
(58) Field of Search .............................. 438/45, 46, 47, 438/93, 94, 602, 603, 604, 962, 979

(56) References Cited

U.S. PATENT DOCUMENTS

| | | | | |
|---|---|---|---|---|
| 5,509,024 A | * | 4/1996 | Bour et al. ................... | 372/45 |
| 5,909,614 A | * | 6/1999 | Krivoshlykov ............... | 438/29 |
| 5,936,266 A | * | 8/1999 | Holonyak, Jr. et al. ..... | 257/106 |
| 6,369,403 B1 | * | 4/2002 | Holonyak, Jr. ............... | 257/13 |
| 6,445,000 B1 | | 9/2002 | Masalkar et al. ............. | 257/21 |
| 6,455,870 B1 | | 9/2002 | Wang et al. ................... | 257/12 |

OTHER PUBLICATIONS

L.V. Asryan and S. Luryi, "Tunneling–Injection Quantum–Dot Laser: Ultrahigh Temperature Stability", IEEE Journal of Quantum Electronics, vol. 37, pp. 905–910 (Jul. 2001).

A.F. Tsatsul'nikov, A.Yu. Egorov, A.E. Zhukov, A.R. Kovsh, V.M. Ustinov, N.N. Ledentsov, M.V. Maksimov, A.V. Sakharow, A.A. Suvorova, P.S. Kop'ev, and Zh.I. Alferov "Modulation Of A Quantum Well Potential By A Quantum Dot Array", Semiconductors 31, 88–91 (1997).

M.V. Maximov, L.V. Asryan, Yu.M. Shernyakov, A.F. Tsatsul'nikov, I.N. Kaiander, V.V. Nikolaev, A.R. Kovsh, S.S. Mikhrin, V.M. Ustinov, A.E. Zhukov, Zh.I. Alferov, N.N. Ledenstov, and D.Bimberg, "Gain and Threshold Characteristics Of Long Wavelength Lasers Based On InAs/GaAs Quantum dots Formed By Activated Alloy Phase Separation", IEEE Journal Of Quantum Electronics, vol. 37, No. 5, May 2001.

E.A. Rezek, N. Holonyak, Jr., B.A. Vojak, G.E. Stillman, J.A. Rossi, D.L. Keune, and J.D. Fairing, "LPE $In_{1-x}Ga_xP_{1-z}As_z$ (x~0.12,z~0.26) DH Laser With Multiple Thin–Layer (<500 Å) Active Region", Appl. Phys. Lett., vol. 31, pp 288–290, Aug. 15, 1977.

G.T. Liu. A. Stintz, H.Li, K.J. Malloy and L.F. Lester, "Extremely Low Room Temperature Threshold Current Density Diode Lasers Using InAs Dots in $In_{0.15}Ga_{85}As$ Quantum Well", Electronics Letters, vol. 35 No. 14 Jul. 8, 1999.

(List continued on next page.)

*Primary Examiner*—David Nhu
(74) *Attorney, Agent, or Firm*—Martin Novack

(57) ABSTRACT

A method of forming a semiconductor device includes the following steps: providing a plurality of semiconductor layers; providing means for coupling signals to and/or from layers of the device; providing a quantum well disposed between adjacent layers of the device; and providing a layer of quantum dots disposed in one of the adjacent layers, and spaced from the quantum well, whereby carriers can tunnel in either direction between the quantum well and the quantum dots.

39 Claims, 12 Drawing Sheets

OTHER PUBLICATIONS

S. Weber, W. Limmer, K. Thonke, R. Sauer, K. Panzlaff, G. Bacher, H. P. Meier, and P. Roentgen, Phys. Rev. B 52, 14739 (1995).

M. Gurioli, J. Martinez–Pastor, M. Colocci, C. Deparis, B. Chastaingt, and J. Massies, Phys. Rev. B 46, 6922 (1992).

W. J. Turner, W. E. Reese, and G. D. Pettit, Phys. Rev. 136, A1467 (1964).

X. B. Zhang, K. L. Ha, and S. K. Hark, J. Electron. Mater. 30, 1332 (2001).

L. Brusaferri, S. Sanguinetti, E. Grilli, M. Guzzi, A. Bignazzi, F. Bogani, L. Carrarresi, M. Colocci, A. Bosacchi, P. Frigeri, and S. Franchi, Appl. Phys. Lett. 69, 3354, (1996).

E. F. Schubert "Delta–Doping Of Semiconductors" (book), Cambridge University Press.

G.T. Liu, A. Stintz, H. Li, T.C. Newell, A.L. Gray, P.M. Varangis, K.J. Malloy, and L.F. Lester, "The Influence Of Quantum–Well Composition On The Performance Of Quantum Dot Lasers Using InAs/InGaAs Dots–In–A–Well (DWELL) Structures", IEEE Journal Of Quantum Electronics, vol. 36, No. 11, Nov., 2000.

A. Stintz, G.T. Liu, Student member, IEEE, H.Li, L.F. Lester, Member, IEEE, and K.J. Malloy, Member IEEE, "Low–Threshold Current Density 1.3$\mu$m InAs Quantum–Dot Lasers With The Dots–In–A–Well (DWELL) Structure", IEEE Photonics Technology Letters, vol. 12, No. 6, Jun. 2000.

J.H. Ryou, R.D. Dupuis, G. Walter, N. Holonyak, Jr., D.T. Mathes, R. Hull, C.V. Reddy and V. Narayanamurti, "Properties Of InP Self–Assembled Quantum Dots embedded In $In_{0.49}(Al_xGa_{1-x})_{0.51}P$ For Visible Light Emitting Laser Applications Grown By Metalorganic Chemical Vapor Deposition", Journal Of Applied Physics, vol. 91, No. 8, Apr. 15, 2002.

P.G. Eliseev, H. Li, A. Stintz, G.T. Liu, T.C. Newell, K.J. Malloy, and L.F. Lester, "Transition Dipole Moment Of InAs/InGaAs Quantum Dots From Experiments On Ultralow–Threshold Laser Diodes", Applied Physics Letters, vol. 77, No. 2, Jul. 10, 2000.

G. Walter, N. Holonyak, Jr., R. Heller and R.D. Dupuis, "Visible Spectrum (654 mn) Room Temperature Continuous Wave (cw) InP Quantum Dot Coupled To InGaP Quantum Well InP–InGaP–In(AlGA)P–InAI1P Heterostructure Laser",Appl. Phys. Lett., vol. 81, No. 24, Dec. 9, 2002.

E.A. Rezek, H. Shichijo, B.A. Vojak, and N. Holonyak, Jr., "Confined–Carrier Luminescence of a Thin $In_{1-x}Ga_xP_{1-z}As_z$ Well (x~ 0.13, z~ 0.29; ~ 400 Å) in an InP p–n Junction," Appl. Phys. Lett., vol. 31, pp. 534–536, Oct. 15, 1977).

J.H. Ryou, R. Dupuis, N. Holonyak, et al. "Photopumped Red–Emitting $InP/In_{0.5}Al_{0.3}Ga_{0.2}P$ Self–Assembled Quantum Dot Heterstructure Lasers Grown By Metalorganic Chemical Vapor Deposition", Appl. Phys. Lett. 78, 4091–4093, Jun. 25, 2001.

T. Richard, E. Chen, A. Sugg, G. Hofler, and N. Holonyak, "High Current Density Carbon–Doped Strained–Layer GaAs ($p^+$)–InGaAs($n^+$)–GaAs($n^+$)p–n Tunnel Diodes", Appl. Phys. Lett. 63, 3616 (Dec. 27, 1993).

H. Saito et al., "Room Temperature Lasing Operation Of A Quantum Dot Vertical Cavity Surface Emitting Laser", Appl. Phys. Lett. 69 (21), Nov. 18, 1996.

M. Maximov et al., "High Power Continuous Wave Operation InGaAs/AlGaAs Quantum Dot Laser", J. Appl. Phys., 83, 10, May, 1998.

G. Walter, N. Holonyak, J. Ryou and R. Dupuis, "Room–Temperature Continuous Photopumped Laser Operation Of Coupled InP Quantum Dot And InGaP Quantum Well InP–In(AlGa)P–InAlP Heterostructures", Appl. Phys. Lett. 79, 1956 (Sep. 24, 2001).

G. Walter, N. Holonyak, J. Ryou and R. Dupuis, "Coupled InP Quantum Dot InGaP Quantum Well InP–In(AlGa)P–InAlP Heterostructure Diode Laser Operation", Appl. Phys. Lett. 79, 3215 (Nov. 2001).

G. Walter, T. Chung, and N. Holonyak, Jr., "High Gain Coupled InGaAs Quantum Well InAs Quantum Dot AlGaAs–GaAs–InAs Heterostructure Diode Laser Operation", Appl. Phys. Lett. 80, 1126 (Feb. 2002).

T. Chung, G. Walter, and N. Holonyak, Jr., "Coupled Strained–Layer InGaAs Quantum–Well Improvement Of An InAs Quantum Dot AlGaAs–GaAs–InAs Heterostructure Laser", Appl. Phys. Lett., 79, 4500 (Dec. 2001).

S. Chuang and N. Holonyak, "Efficient Quantum Well To Quantum Dot Tunneling: Analytical Solutions", Appl. Phys. Lett. 80, 1270 (Feb. 2002).

J.M. Dallesasse, N. Holonyak, Jr., A.R. Sugg, T.A. Richard, and N. El–Zein, Appl. Phys. Lett. 57, 2844 (1990).

* cited by examiner

| GaAs cap t=5nm |
|---|
| InAlP upper cladding layer t=0.4μm |
| InAlGaP (x=0.4) outer waveguide t=0.1μm |
| InAlGaP (x=0.2) inner waveguide t=54nm |
| InP QD layer 1 (t=15ML) |
| InAlGaP (x=0.2) inner waveguide t=54nm |
| InAlGaP (x=0.4) waveguide t=0.1μm |
| InAlP lower cladding layer t=0.4μm |
| GaAs buffer |
| GaAs (100) |

$\lambda/2$ cavity for $\lambda=650$nm (inner waveguide, QD layer, inner waveguide)

FIG. 5A

| GaAs cap t=5nm |
|---|
| InAlP upper cladding layer t=0.4μm |
| InAlGaP (x=0.3) waveguide t=54nm |
| InP QD layer 1 (t=15ML) |
| InAlGaP (x=0.3) waveguide t=54nm |
| InAlP lower cladding layer t=0.4μm |
| GaAs buffer |
| GaAs (100) on axis; 10°--<110> |

$\lambda/2$ cavity for $\lambda=650$nm

FIG. 5B

| GaAs cap $t=5$nm |
|---|
| InAlP upper cladding layer $t=0.4\mu$m |
| InAlGaP ($x=0.3$) inner waveguide $t=50$nm |
| InP QD layer 4 ($t=15$ML) |
| InAlGaP ($x=0.3$) barrier $t=5$-$10$nm |
| InP QD layer 3 ($t=15$ML) |
| InAlGaP ($x=0.3$) barrier $t=5$-$10$nm |
| InP QD layer 2 ($t=15$ML) |
| InAlGaP ($x=0.3$) barrier $t=5$-$10$nm |
| InP QD layer 1 ($t=15$ML) |
| InAlGaP ($x=0.3$) inner waveguide $t=50$nm |
| InAlP lower cladding layer $t=0.4\mu$m |
| GaAs buffer |
| GaAs (100) |

$\lambda/2$ cavity for $\lambda=650$nm

FIG. 5C

| GaAs cap $t=5$nm |
|---|
| InAlP upper cladding layer $t=0.4\mu$m |
| InAlGaP ($x=0.3$) inner waveguide $t=50$nm |
| InP QD layer 3 ($t=15$ML) |
| InAlGaP ($x=0.3$) barrier $t=5$nm |
| InP QD layer 2 ($t=15$ML) |
| InAlGaP ($x=0.3$) barrier $t=5$nm |
| InP QD layer 1 ($t=15$ML) |
| InAlGaP ($x=0.3$) inner waveguide $t=50$nm |
| InAlP lower cladding layer $t=0.4\mu$m |
| GaAs buffer |
| GaAs (100) |

$\lambda/2$ cavity for $\lambda=650$nm

FIG. 5D

| GaAs cap t=5nm |
|---|
| InAlP upper cladding layer t=0.4μm |
| InAlGaP (x=0.3) inner waveguide t=45nm |
| InP QD layer 3 (t=15ML) |
| InAlGaP (x=0.3) barrier t=2nm |
| InGaP QW communication layer (t=2nm) |
| InAlGaP (x=0.3) barrier t=2nm |
| InP QD layer 2 (t=15ML) |
| InAlGaP (x=0.3) barrier t=2nm |
| InGaP QW communication layer (t=2nm) |
| InAlGaP (x=0.3) barrier t=2nm |
| InP QD layer 1 (t=15ML) |
| InAlGaP (x=0.3) inner waveguide t=45nm |
| InAlP lower cladding layer t=0.4μm |
| GaAs buffer |
| GaAs (100) |

$\lambda/2$ cavity for $\lambda=650nm$ (layers from inner waveguide to inner waveguide)

FIG. 7

SEMICONDUCTOR DEVICES AND METHODS

RELATED APPLICATION

The present Application claims priority from U.S. Provisional Application No. 60/309,149, filed Jul. 31, 2001, and said Provisional Application is incorporated herein by reference.

This invention was made with Government support, and the Government has certain rights in this invention.

FIELD OF THE INVENTION

This invention relates to the field of semiconductor devices and methods of making same, and, more particularly, to a semiconductor device having a quantum well and a layer of quantum dots spaced from the quantum well, and to a method of making such a device.

BACKGROUND OF THE INVENTION

In 1977 there was introduced the quantum-well (QW) laser, a laser that in the active region employs one or more thin quantum well layers ($L_z$ less than about 400 Å) sandwiched in a thicker waveguide region that is further enclosed by still higher gap p-type and n-type confining layers (see E. A. Rezek, N. Holonyak, Jr., B. A. Vojak, G. E. Stillman, J. A. Rossi, D. L. Keune, and J. D. Fairing, "LPE $In_{1-x}Ga_xP_{1-z}As_z$ (x~0.12,z~0.26) DH Laser With Multiple Thin-Layer (<500 Å) Active Region," Appl. Phys. Lett., vol 31, pp 288–290, Aug. 15, 1977; E. A. Rezek, H. Shichijo, B. A. Vojak, and N. Holonyak, Jr., "Confined-Carrier Luminescence of a Thin $In_{1-x}Ga_xP_{1-z}As_z$ Well (x~0.13, z~0.29; ~400 Å) in an InP p-n Junction," Appl. Phys. Lett., vol. 31 pp. 534–536, Oct. 15, 1977). For about ten years, numerous groups have been trying to convert the quantum well laser, which is practical and widely manufactured, into a so-called quantum-dot laser. The goal has been to build an ultimate laser. In theory, the thin quantum well layer (or layers) of a QW laser is "cut-up" into (ideally) a uniform dense sheet of identical little quantum boxes (i.e., quantum dots). With such a structure, instead of the electrons and holes being injected (via current, light, etc.) and collected in an easily grown thin ($L_z$ less than about 400 Å) uniform QW sheet (thus with one dimensional thickness confinement and quantization; a 2-D structure), the electrons and holes are collected and recombine in the little quantum dots (i.e., quantum boxes; hence, three-dimensional confinement and quantization; a O-D structure). The little boxes, or dots, are like "fat" little molecules and (ideally) all alike and densely and uniformly arranged. [Reference can be made, for example, to U.S. Pat. No. 6,369,403, and to J. H. Ryou, R. Dupuis, G. Walter, D. Kellog, N. Holonyak, Jr., D. Mathes, R. Hull, C. Reddy, and v. Narayanamuri, Appl. Phys. Lett. 78, 4091 (2001).] Actually, the quantum dots are stochastic and probabilistic, small but random. They are random in geometry, in size, and in arrangement - - - and not dense enough, i.e., are not in sufficient proximity to be quantum coupled (by tunneling). Electron-hole (e-h) pairs are stuck in each box (assuming they are collected at all) and don't transport to neighboring boxes. The e-h pairs don't move around and rearrange in the plane of the dots as readily as they do in a thin QW sheet ($L_z$ less than about 400 Å; $L_x$, $L_y$ extended in the plane; hence a 2-D structure). In short, there is little or no conduction along the sheet (or sheets) of quantum dots.

It is among the objects of the present invention to provide devices, and methods of making same, which are responsive to the foregoing limitations of the prior art, and to also provide devices which exhibit improved operation as light emitters and as other applications.

SUMMARY OF THE INVENTION

A major problem with quantum dot heterostructures (QDHS) is the stochastic nature of QD structures, the lack of uniformity, insufficient QD density, and poor QD-to-QD coupling. In accordance with an aspect hereof, a solution to the problem is to couple, via a thin barrier, the sheet (or multiple sheets) of QDs to a QW layer, e.g., to the QW layer of a QW laser. The higher energy states of the QDs are resonant with and couple by tunneling to the lower confined-particle states of the thin uniform QW layer. Electron-hole transport in the QW layer can re-arrange the e-h pairs in the plane and provide the dot-to-dot coupling. That is, an electron tunnels from the QD to the QW layer, transports in the plane in the QW layer, and re-tunnels back into another QD. Hence, one can couple the QDs - - - not in the plane, but out of the plane into a QW layer, then at some other point in the plane of the QW layer back into another QD. In this manner, the invention makes it possible for the charge to get unstuck from a QD and move from dot to dot in the waveguide region to help optimize emission.

Also, should the QDs not collect injected electron-hole pairs efficiently (a distinct possibility), the thin auxiliary QW layer (or, if necessary or desirable, multiple QW layers) will collect the injected carriers and feed them via resonant tunneling into the quantum dots to then scatter the carriers down to the lower energy dot states for recombination (for photon generation and laser operation). It is clear that multiple QD layers and multiple QW auxiliary or connection (communication) layers can be employed and can be part of laser or other device designs.

In accordance with a further aspect hereof, the quantum dots, since they are a lower gap component of the III-V QD heterostructure, can be doped or be left undoped. In other words, the QD can be modified into a quantum "doping ball."There may be advantages in employing n-type or p-type QD "doping balls", just as there may be device-design reasons to leave the QW auxiliary connection or communication layer undoped, or doped n-type or doped p-type. The QW auxiliary connection layer can be close coupled to the QDs (small separating barrier thickness) or can be weakly coupled (large barrier thickness). Also, the QW auxiliary layer can be thicker and drop its lower confined-particle states below the lowest QD states, or can be made thinner and raise its lowest confined-particle states above the lowest QD states. The foregoing types of techniques and structures can be incorporated into field effect transistor devices. For example, doped QDs, i.e., "doping balls," can be used to modify the so-called pseudomorphic transistor into a new form of field effect transistor. The doped QDs can be employed with or without auxiliary QW layer(s).

After GaAs ($E_g$=1.42 eV) it becomes almost impossible to make a higher gap, say GaP ($E_g$=2.26 eV), tunnel diode. Higher gaps (higher energies) require narrower tunneling distances, which in a p-n tunnel diode requires higher doping, not, as is common, the lower impurity solubility that comes with higher gap.

A tunnel diode can be devised that is not one large uniform junction, but rather an array of microscopic tunnel junctions, for instance an array of doped quantum dots on the n side of a pn junction. For example, the GaAs(p$^+$)—InGaAs(n$^+$)—GaAs(n$^+$)p-n tunnel diode made in 1993

(Richard, et al., Appl. Phys. Lett. 63, 3616 (Dec 27, 1993), i.e., the narrow gap InGaAs center region, a reduced barrier, can be "cut up" into quantum dots. The significance of this kind of structure for tunnel contacts on VCSEL lasers, etc., can be understood in conjunction with U.S. Pat. No. 6,369,403.

Similar doped QDs, of a type that are employed in a tunnel contact or a tunnel diode, are the same type of <u>doped</u> QDs, or doping balls (DBs) that can be used as doping sources in any layered heterostructure, including in all the various kinds of quantum dot (QD) light emitting devices (e.g. lasers) that are described in numerous articles in the journal literature. Doping dots (DDs), or doping balls (DBs), can be laced through high gap material (in layers) to act as the source of carriers. The little QD doping ball, being small enough, can be incorporated into the higher gap material even if lattice mismatched and not create defects (dislocations). The doping ball, and its "squeezed" higher energy states, carries impurity at the solubility limits of the QD material, for example, an InP QD in higher gap $In_{0.5}Ga_{0.5}P$ or in $In_{0.5}Al_{0.3}Ga_{0.2}P$, and not at the solubility limits of the higher gap layer (the matrix) into which the QDs are incorporated.

The layers or regions of doping QDs (DDs or DBs) are versatile layers (n-type, p-type, or undoped) that can be incorporated into heterostructure devices, just as quantum wells, barriers, coupling barriers, waveguide regions, confining layers, etc. are incorporated into devices. Various kinds of devices, light emitters (LEDs and lasers), detectors, transistors, etc., can benefit. The QDs needn't be viewed as just little "boxes" for carrier recombination (as in today's QD lasers), i.e., a "center" for improved carrier recombination, but, more broadly, the QD can be viewed as a special little "box" that can carry impurity into a region that otherwise is difficult to dope, or that offers an opportunity for enhanced doping. All the III-V materials are candidates for QD layering and doping dot techniques and devices. The nitride materials are relatively high gap and relatively hard to dope, and would therefore particularly benefit from employment of doping dots.

In accordance with a form of the invention, there is set forth a method of forming a semiconductor device, including the steps of: providing a plurality of semiconductor layers; providing a means for coupling signals to and/or from layers of the device; providing a quantum well disposed between adjacent layers of the device; and providing a layer of quantum dots disposed in one of the adjacent layers, and spaced from the quantum well, whereby carriers can tunnel in either direction between the quantum well and the quantum dots. In an embodiment of this form of the invention the quantum dot layer is spaced from said quantum well layer by a barrier layer and the barrier layer has a thickness in the range about 5 Angstroms to 100 Angstroms. In this embodiment, the step of providing a layer of quantum dots comprises providing doped quantum dots. Also in this embodiment, the step of providing doped dots comprises providing dots doped to a concentration of at least $N=10^{15}/cm^3$ for n-type doping, and providing dots doped to a concentration of at least $N=10^{16}/cm^3$ for p-type doping. Further in this embodiment, the step of providing dots comprises providing dots having an average size in the range 10 to 100 Angstroms height and 10 to 200 Angstroms diameter, and having an average density in the range $10^{10}$ to $10^{12}$ per $cm^2$.

In accordance with a further form of the invention, there is provided a semiconductor device which comprises: a plurality of semiconductor layers; means for coupling signals to and/or from layers of the device; a quantum well disposed between adjacent layers of the device; and a layer of quantum dots disposed in one of the adjacent layers, and spaced from the quantum well, whereby carriers can tunnel in either direction between the quantum well and the quantum dots.

In accordance with another form of the invention, there is provided a semiconductor device which comprises: a plurality of III-V semiconductor layers; means for coupling signals to and/or from layers of the device; and a layer of doped quantum dots disposed in at least one of the layers as a source of carriers that can communicate in either direction between the dots and another layer.

Further features and advantages of the invention will become more readily apparent from the following detailed description when taken in conjunction with the accompanying drawings.

BRIEF DESCRIPTION OF THE DRAWINGS

FIG. 5 show samples of III-V heterostructures having quantum dot layers (without coupled quantum well), from which test devices were made.

FIGS. 6 and 7 show samples of III-V heterostructures having coupled quantum well and quantum dot layers, from which test devices were made.

DETAILED DESCRIPTION

Figure 1:
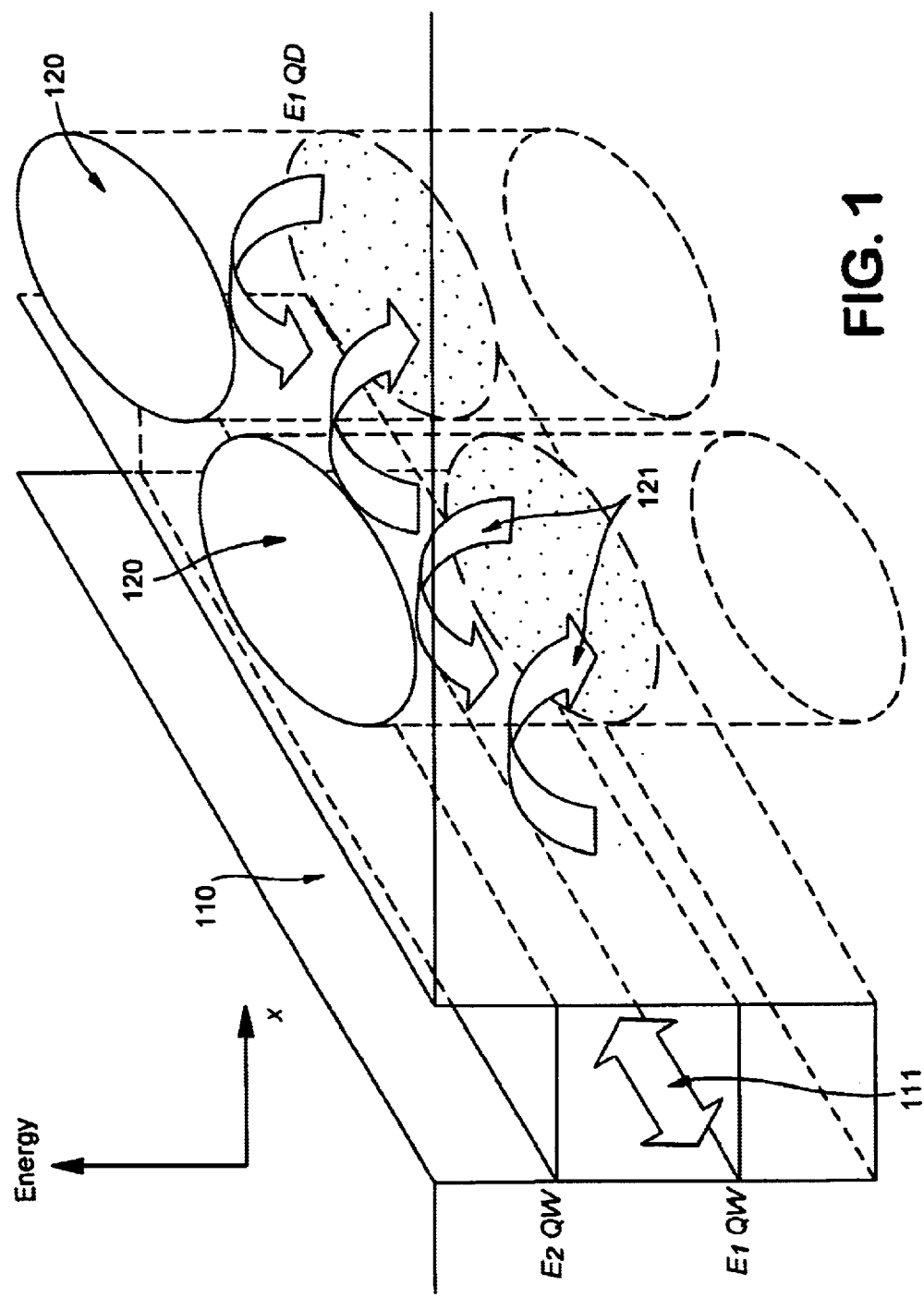
FIG. 1 is a diagram illustrating intra-QW carrier transport, and inter-QD-QW transport (in both directions) by tunnelling of carriers in a device with a quantum dot layer disposed in close proximity to a quantum well layer.

FIG. 1 is a diagram illustrating intra-QW carrier transport, and inter-QD-QW transport (in both directions) by tunnelling of carriers in a device with a quantum dot layer disposed in close proximity to a quantum well layer. In FIG. 1, the vertical direction represents energy level, and the x direction is normal to the plane of the device layers. The quantum well communication layer is represented at 110, and quantum dots are represented at 120. Quantum well energy states are labelled at $E_1QW$ and $E_2QW$, and quantum dot energy state is labelled at $E_1QD$. Double-headed arrow III represents intra QW transport, and the arrows 121 represent inter QW-QD transport in both directions. As seen from the diagram, an electron can, for example, tunnel from quantum dot to the quantum well layer, transports in the quantum well layer, and re-tunnels back into another quantum dot. In this manner, it is possible for the charge to get unstuck from a quantum dot and move from dot to dot in the waveguide region of the dot, for example, to enhance recombination radiation emission.

Figure 2:
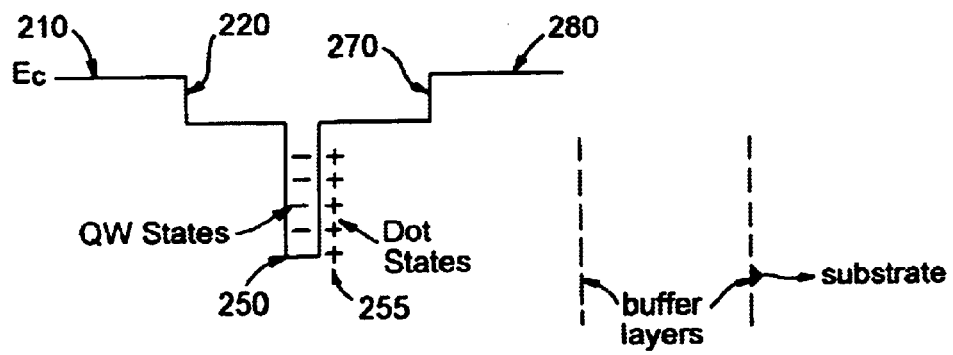
FIGS. 2 and 3 are energy diagrams for two respective III-V quantum well heterostructure light emitting devices having quantum dots in close proximity to and coupled with the quantum well.
Figure 3:
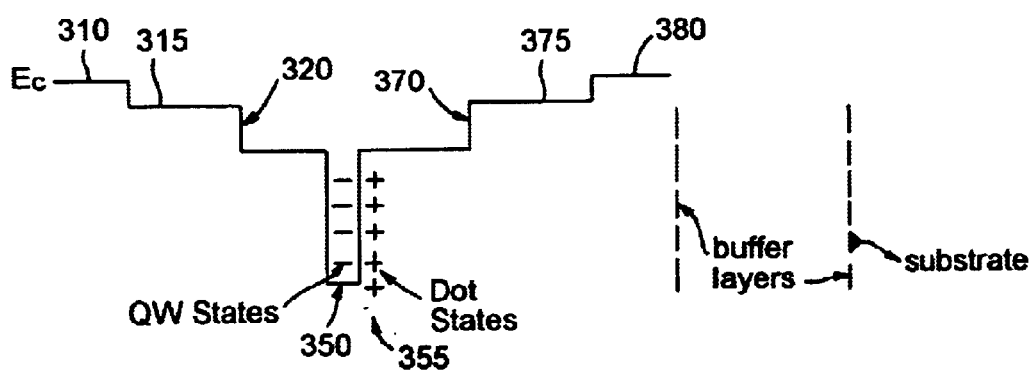

FIGS. 2 and 3 are energy diagrams for two respective III-V quantum well heterostructure light emitting devices having quantum dots in close proximity to and coupled with the quantum well.

The FIG. 2 device has In AlP confining layers of respective p and n type (210, 280), In (AlGa)P guiding layers (220, 270) defining the waveguide region, an InGaP quantum well (250), the QW states being shown, and an InP quantum dot layer (255), the QD states also being shown.

The FIG. 3 device has $Al_yGa_{1-y}As$ and $Al_xGa_{1-x}As$ cladding layers of respective p and n type (310, 315 and 380, 375), GaAs guiding layers (320, 370) defining the waveguide region, an InGaAs quantum well (350), the QW states being shown, and an InGaAs quantum dot layer (355), the QD states also being shown.

Figure 4:
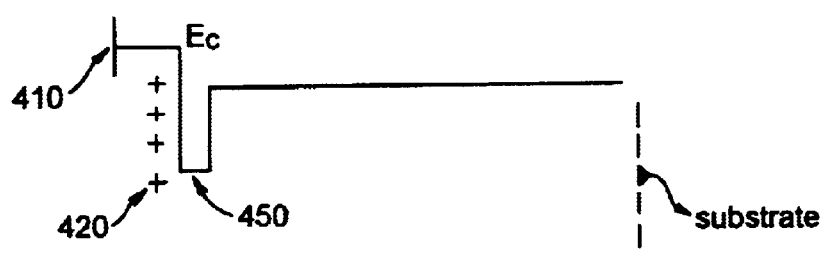
FIG. 4 is an energy diagram for a III-V pseudomorphic field effect transducer device employing doping dots.

FIG. 4 is an energy diagram for a III-V pseudomorphic field effect transducer device employing doping dots. The FIG. 4 device has a crystal surface 410, for example InGaP or AlGaAs, on which the metal gate electrode is deposited. InAs doping dots 420, in a thin barrier of InGaP or AlGaAs are closely spaced from an InGaAs quantum well 450 (together comprising the channel) on GaAs.

FIG. 5 show samples of III-V heterostructures having quantum dot layers (without coupled quantum well), from which test devices were made. FIGS. 5A, 5B, 5C, and 5D show the layer structure of three samples used for testing to show a baseline for conventional quantum dot devices. The samples of FIGS. 5A and 5B have a single quantum dot layer, and the sample of FIG. 5c has multiple quantum dot layers. In these and the subsequent samples, the In(AlGa)P layers are $In_{0.5}(Al_xGa_{1-x})l_{0.5}P$.

Figure 6A:
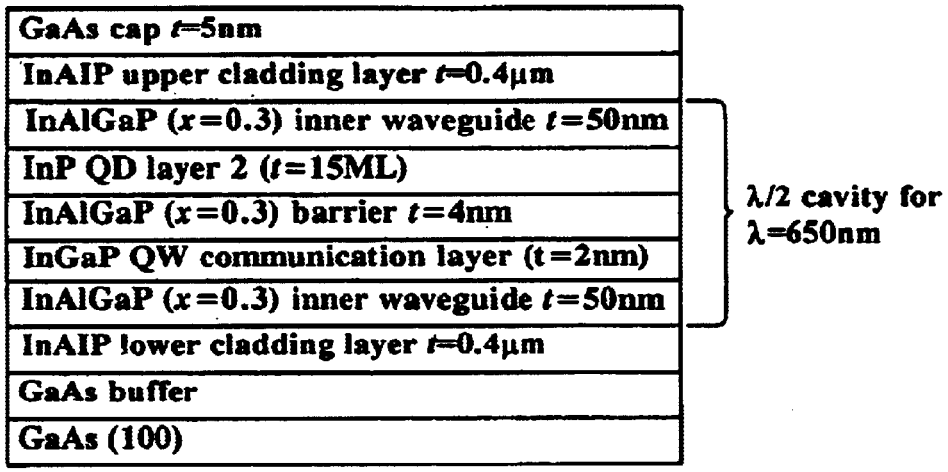
Figure 6B:
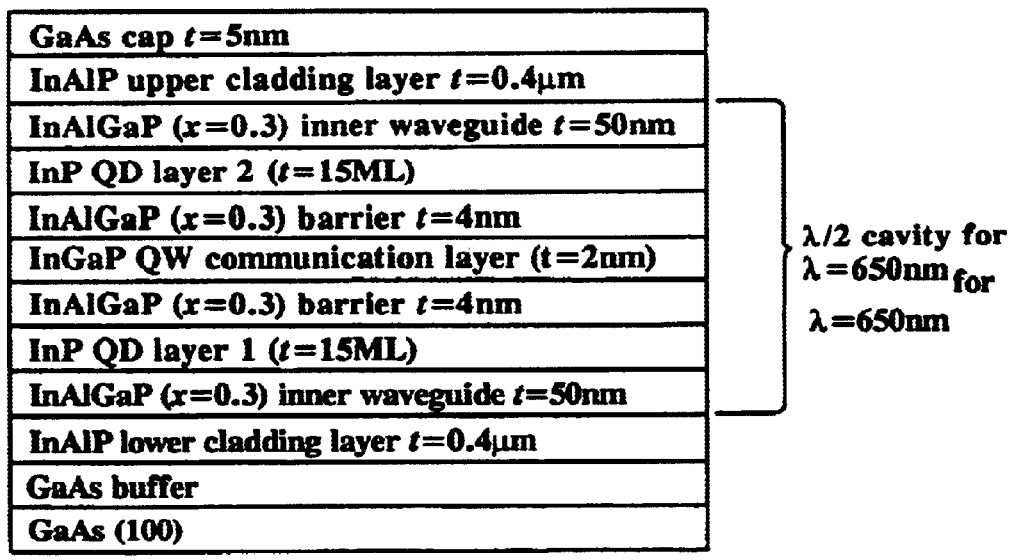

FIGS. 6 and 7 show samples of III-V heterostructures having coupled quantum well and quantum dot layers, from which test devices were made. In FIG. 6A, the sample has a single quantum dot layer and a single quantum well communication layer. The FIG. 6B sample has plural quantum dot layers and quantum well communication layer therebetween. The FIG. 7 sample has multiple quantum dot layers with quantum well communication layers therebetween.

Figure 8:
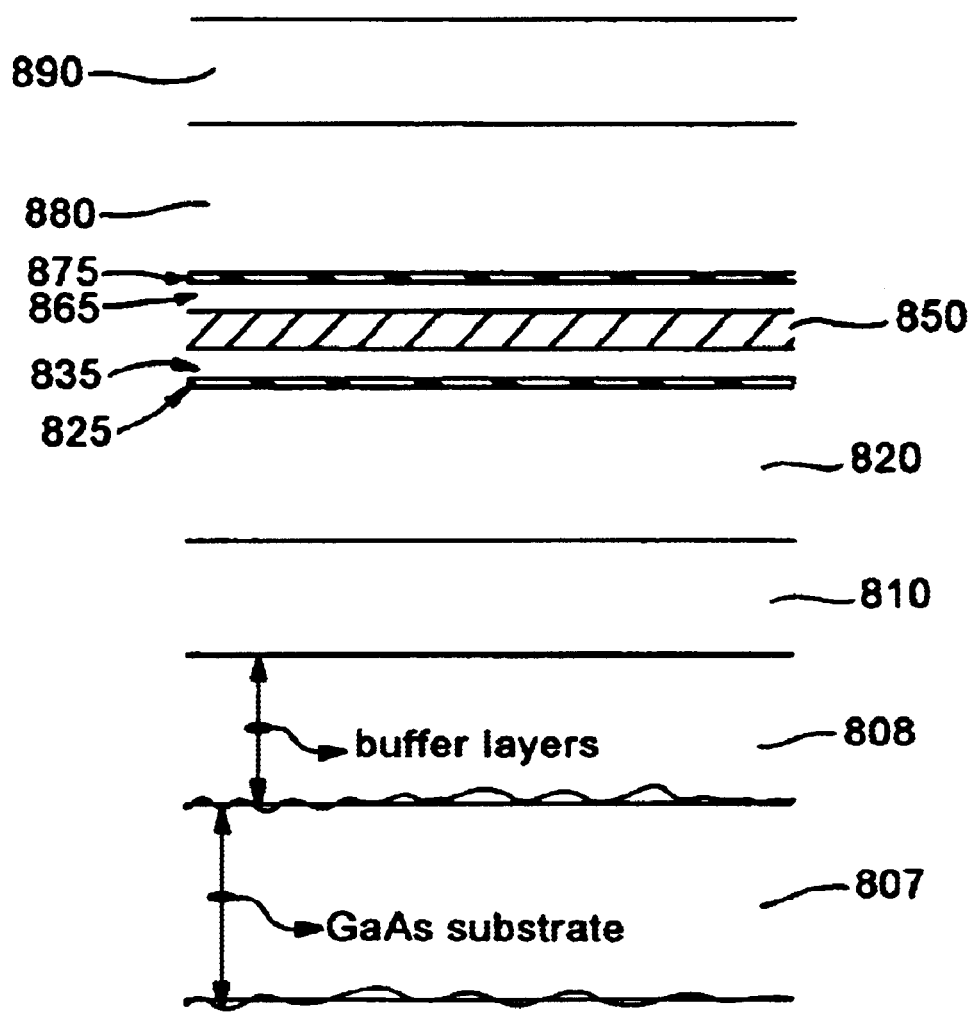
FIG. 8 is a diagram of a III-V coupled QD-QW heterostructure laser.

FIG. 8 is a diagram of a III-V coupled QD-QW heterostructure laser. The structure shown is similar to that of the sample of FIG. 6B, with a single InGaP communicating quantum well between layers of InP quantum dots. In the diagram of FIG. 8, the layers 810 and 890 are, respectively, n-type and p-type $In_{0.5}Al_{0.5}P$ lower and upper cladding layers. The layers 820 and 880 are, respectively, $In_{0.5}(Al_xGa_{1-x})_{0.5}P$ lower and upper waveguide layers. The InP quantum dot layers are represented at 825 and 875, and are separated from the $In_{0.5}Ga_{0.5}P$ quantum well communication layer 850 by thin barriers 835 and 865 of $In_{0.5}(Al_xGa_{1-x})_{0.5}P$. GaAs substrate and buffer layers are shown at 807 and 808, and a GaAs cap layer can be deposited on the layer 890. Suitable metallization can also be applied. In this embodiment, the quantum well thickness is in the range 20 to 100 Angstroms, the barriers are in the range 5 to 15 mono-layers. The waveguide thickness is about 1000 Angstroms.

In G. Walter, N. Holonyak, Jr., J. Ryou and R. Dupuis, Appl. Phys. Lett. 79, 1956 (September 2001) we present data demonstrating continuous 300 K photopumped InP quantum dot laser operation (656–679 nm) of an InP—In (AlGa)P—InAlP heterostructure, in accordance with the principles hereof, grown by metalorganic chemical vapor deposition.

In G. Walter, N. Holonyak, Jr., J. Ryou and R. Dupuis, Appl. Phys. Lett. 79, 3215 (November 2001) we present data showing that a p-n InP—$In_{0.5}Ga_{0.5}P$—$In_{0.5}$ ($Al_{0.3}Ga_{0.2}$) P—$In_{0.5}Al_{0.5}P$ quantum dot (QD) heterostructure diode, with an auxiliary ~20 Å InGaP quantum well coupled via an In(AlGa)P barrier (~20 Å) to the single layer of QDs to aid carrier collection, in accordance with the principles hereof, has a steeper current-voltage characteristic than the case of a similar diode with no auxiliary QW.

In G. Walter, T. Chung, and N. Holonyak, Jr. Appl. Phys. Lett. 80, 1126 (February 2002), data are given showing that a single-layer InAs quantum dot (QD) laser in the AlGaAs—GaAs—InGaAs—TnAs heterostsructure system is improved in gain and continuous wave (cw) room temperature operation by coupling, via tunneling, auxiliary strained-layer InGaAs quantum wells to the single InAs QD layer, in accordance with the principles hereof, to assist carrier collection and thermalization. A QW-assisted single-layer InAs QD+QW laser was demonstrated that operated cw (300 K), and a diode length 150 $\mu$m in pulsed operation, exhibiting gain as high as ~100 $cm^{-1}$.

Regarding formation of the quantum dot layer(s), reference can be made to T. Chung, G. Walter, and N. Holonyak, Jr. Appl. Phys. Lett., 79, 4500 (December 2001), wherein data are presented showing that, besides the improvement in carrier collection, it is advantageous to locate strain-matching auxiliary InGaAs layers (quantum wells) within tunneling distance of a single-quantum-dot (QD) layer of an AlGaAs—GaAs—InGaAs—InAs QD heterostructure laser to realize also smaller size QDs of greater density and uniformity.

A theoretical analysis of a QD plus QW device, in accordance with the principles hereof, is described in S. Chuang and N. Holonyak, Jr., Appl. Phys. Lett. 80, 1270 (February 2002). Calculations showed that the added requirement of tunneling in the device does not impede the population of the dot states.

In a further embodiment hereof, the gain and performance of a device is improved by coupling, via resonance tunneling, the ground state of an unstrained 70 Å InGaP QW (~654 nm peak) to the collective (stochastic) first excited state of the 7.5 ML (monolayer) InP QDs (~654 nm). High efficiency 300 K cw laser operation at ~654 nm is realized for the coupled InP QD+InGaP QW p-n InP—InGaP—In (AlGa)P—InAlP heterostructure.

The InP QD+InGaP QW heterostructure is grown by metalorganic chemical vapor deposition (MOCVD). The growth of the AlGaAs/InAlP cladding/InAlGaP guiding layer and barrier/InGaP quantum well/InP quantum dot heterostructure is accomplished on Si-doped GaAs (100) on-axis substrates by low-pressure MOCVD in a modified EMCORE GS3200-UTM reactor at a pressure of 60 Torr and a growth temperature of 650° C. Adduct purified trimethylindium, triethylgallium, and trimethylaluminum are used for the Column III sources, and high-purity 100% arsine and phosphine for the Group V sources with purified $H_2$ as the carrier gas. The dopant sources are disilane (n-type) and bis(cyclopentadienyl)magnesium (p-type). The growth of the epitaxial layers consists first of an n-type (Si) highly doped GaAs buffer layer, followed by an n-type (Si) $In_{0.5}Al_{0.5}P$ lower cladding layer (600 nm), and next the undoped waveguide and active region consisting of two $In_{0.5}Al_{0.3}Ga_{0.2}P$ guiding layers (120 nm) on each side of the $In_{0.5}Ga_{0.5}P$ QW (7 nm) coupled to the InP QDs(7.5 ML) by a thin $In_{0.5}Al_{0.3}Ga_{0.2}P$ barrier (2 nm). The structure then has on top a p-type (Mg-doped) $In_{0.5}Al_{0.5}P$ cladding layer (600 nm), a p-type (Mg) $Al_{0.85}Ga_{0.15}As$ layer (200 nm) for stripe-geometry oxidation, and a p-type (Mg) GaAs contact layer (100 nm).

For the QD+QW laser diode, fabrication is performed by first patterning 12 μm protective $SiN_4$ stripes on the crystal. The p-type $Al_{0.85}Ga_{0.15}As$ oxidizable layer is then exposed by shallow wet etching and oxidized for 20 minutes at 430° C. in a furnace supplied with $N_2+H_2O$ (see J. M. Dallesasse, N. Holonyak, Jr., A. R. Sugg, T. A. Richard, and N. El-Zein, Appl. Phys. Lett. 57, 2844 (1990)), resulting in the formation of ~10 μm non-oxidized stripes defining the current aperture and waveguide width. The 10 μm protective stripes ($SiN_4$) on top are removed and the samples are then lapped to ~100 μm, metallized with Au—Ge on the n-type side and Ti—Au on the p-type side. Diode samples are cleaved, the p-side clamped downward on In-coated Cu heat sinks and the diodes probe tested. For the QD reference samples (no QW), the fabrication (as above) is as described in G. Walter, N. Holonyak, Jr., J. H. Ryou, and R. D. Dupuis, Appl. Phys. Lett. 79, 3215 (2001).

Figure 9:
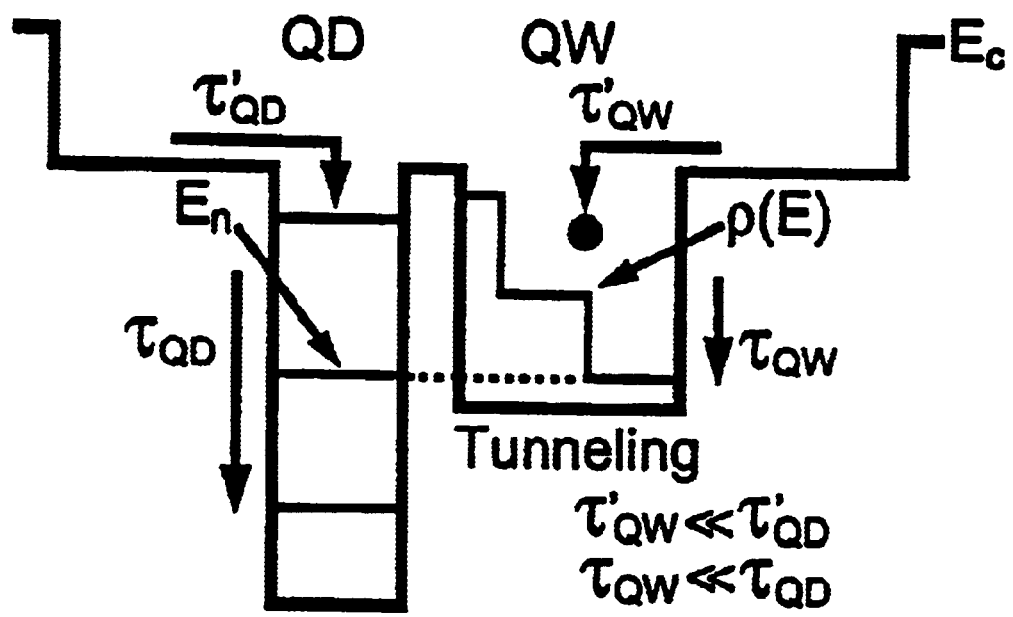
FIG. 9 is an energy diagram for a further embodiment of the invention.

A laterally continuous (x,y connected) QW is superior to QDs in terms of carrier capture time ($\tau'_{QW} << \tau'_{QD}$) and also carrier-to-ground-state relaxation time ($\tau_{QW} << \tau_{QD}$). Additionally, unlike QDs that are spatially separated, a laterally continuous QW (with only z confinement) allows carriers to redistribute efficiently laterally (e.g., to accommodate carrier "hole" burning). By coupling a QW to the QD layer as shown in FIG. 9, one can allow faster "feed" of carriers into the QDs. With faster capture time, carriers are captured predominantly by the QW and then relax quickly to the ground state of the QW, and tunnel (see S. L. Chuang and N. Holonyak, Jr., Appl. Phys. Lett. 80, 1270 (2002)) into and recombine at the QDs. The discreteness of the QD states, because of tunneling coupling, enhances the recombination behavior of the QW+QD system. Owing to the spatial separation of the QDs, enhancement of the recombination along the plane of the QW results in "preferred" recombination centers ("sweet spots") and a certain degree of mode selection. The barrier layer and its properties become design parameters in QW to QD or QD to QW recombination enhancement (as does, of course, QD and QW sizes).

Figure 10:
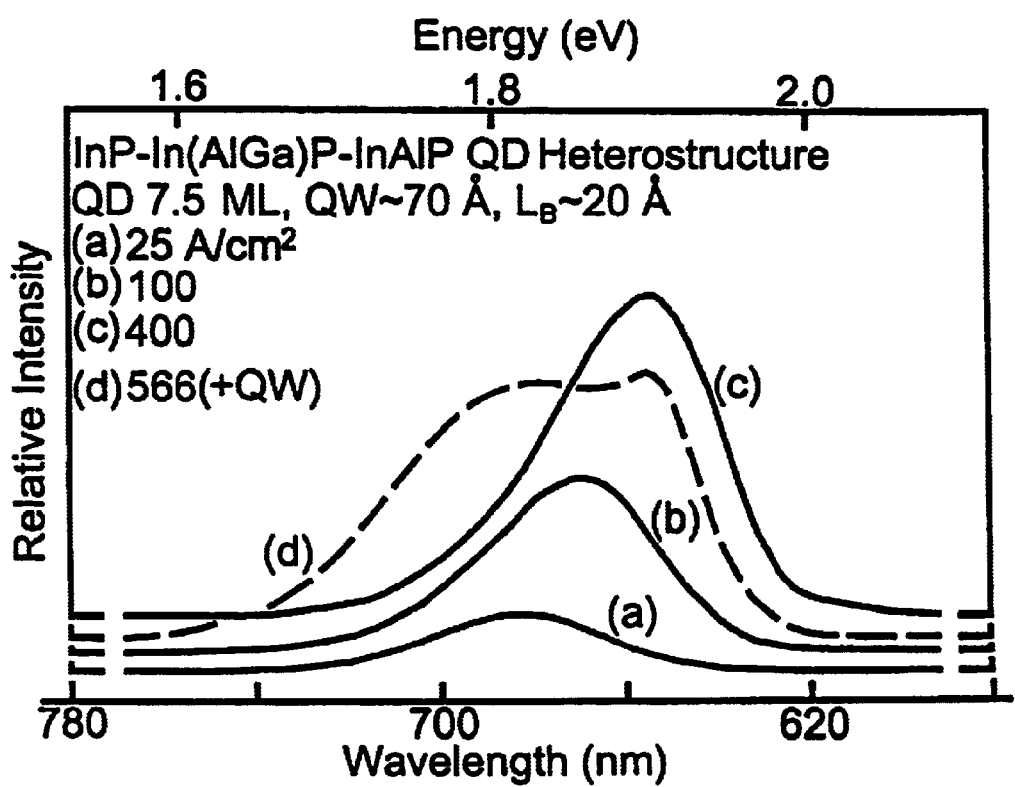
FIG. 10 shows pulse excited spectra for the further embodiment of the invention.

For comparison purposes, it is shown, in FIG. 10, the pulse excited (3% duty cycle) recombination spectra of a 400 μm long by 100 μm wide single layer 7.5 ML QD diode (no QW). Curves (a), (b) and (c) exhibit, at increasing current, the bandfilling of the QD diode, the bandfilling peak occurring at ~655 nm (n=2). The diode and photopumping characterization of similar QD+QW heterostructures confirms also the presence of collective QD states in a band at ~655 nm (see G. Walter, N. Holonyak, Jr., J. H. Ryou, and R. D. Dupuis, Appl. Pyhys. Lett. 79, 3215 (2001); J. H. Ryou, R. D. Dupuis, G. Walter, D. A. Kellogg, N. Holonyak, Jr., D. T. Mathes, R. Hull, C. V. Reddy, and V. Narayanamurti, Appl. Phys. Lett. 78, 4091 (2001); J. H. Ryou, R. D. Dupuis, G. Walter, D. A. Kellogg, N. Holonyak, Jr., D. T. Mathes, R. Hull, C. V. Reddy, and V. Narayanamurti). Curve (d), which is taken from the QD+QW diode has been added for reference to show how bandfilling advances in the two cases, i.e., QD alone vs. QW+QD which changes shape.

Figure 11:
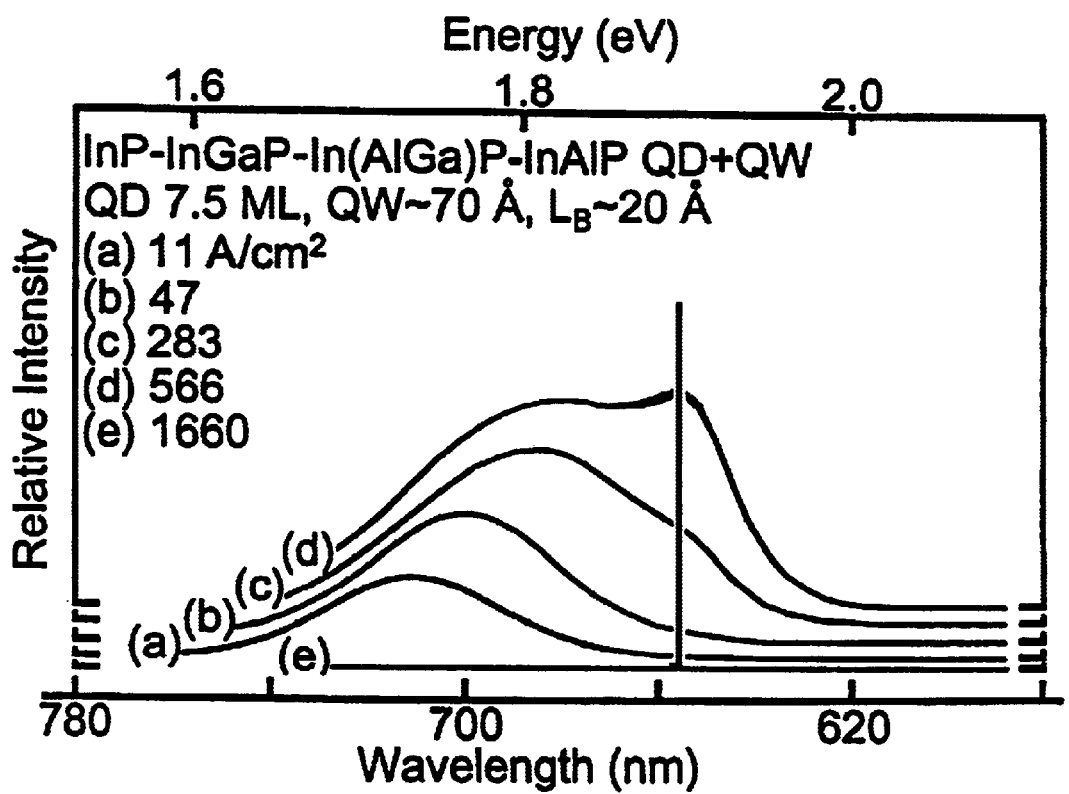
FIG. 11 shows recombination radiation spectra for the further embodiment of the invention.

FIG. 11 shows the recombination radiation spectra of a 530 Am long by 10 μm wide QD+QW laser. The 7.5 ML InP QD layer is coupled to a 70 Å InGaP QW via a 20 Å $In_{0.5}Al_{0.3}Ga_{0.2}P$ tunneling barrier. The QW is designed to have a spectral peak and QW-QD resonance enhancement at ~654 nm. By coupling the QW to an upper state of the QD rather than to a lower state, one observes more easily the QW-QD enhancement. As shown by curves (a) and (b), at lower current levels longer wavelength QD recombination radiation is evident, consistent with efficient QW carrier capture and tunneling transfer to the QDs which supports the lower energy recombination. Unlike the QD diode of FIG. 10, however, the bandfilling process tends to saturate (peak at 682 nm) and change form. At higher energy, a narrow wavelength peak emerges in the resonance region at 654 nm. The narrow spectra peak at 654 nm continues to increase with increasing current, with laser threshold occurring at 82 mA. Curve (e) shows at 99 mA onset of single mode operation for the QD+QW laser diode.

Figure 12:
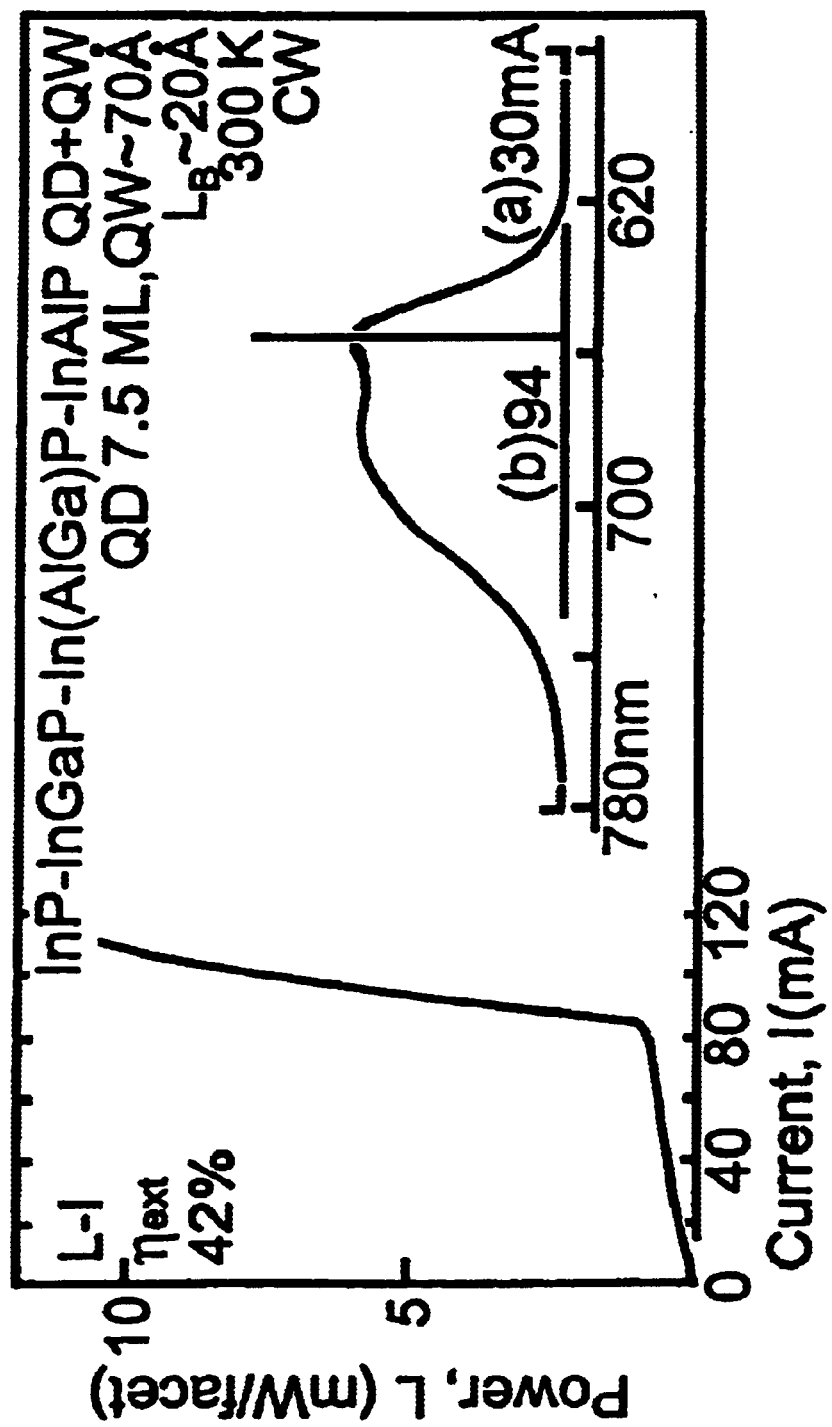
FIG. 12 shows L-I characteristics for the further embodiment of the invention.

FIG. 12 shows the L-I characteristic of the InP QD+ InGaP QW laser of the FIG. 11. The peak power of 11 mW/facet is limited by the relatively weak heating sinking. Stable single mode operation is observed from 88 mA to 94 mA. At currents exceeding 94 mA or ~2.9 mW/facet, we see another lasing mode appearing at longer wavelength, the effect of heating. The twin mode operation continues beyond 100 mA. The external quantum efficiency, $\eta_{ext}$, for the device of FIG. 12 is 42%, with a characteristic temperature of 137 K measured for operation in the temperature range of 20 to 60° C. Single mode behavior is observed also for diodes of 400 μm and 1050 μm lengths.

Figure 13:
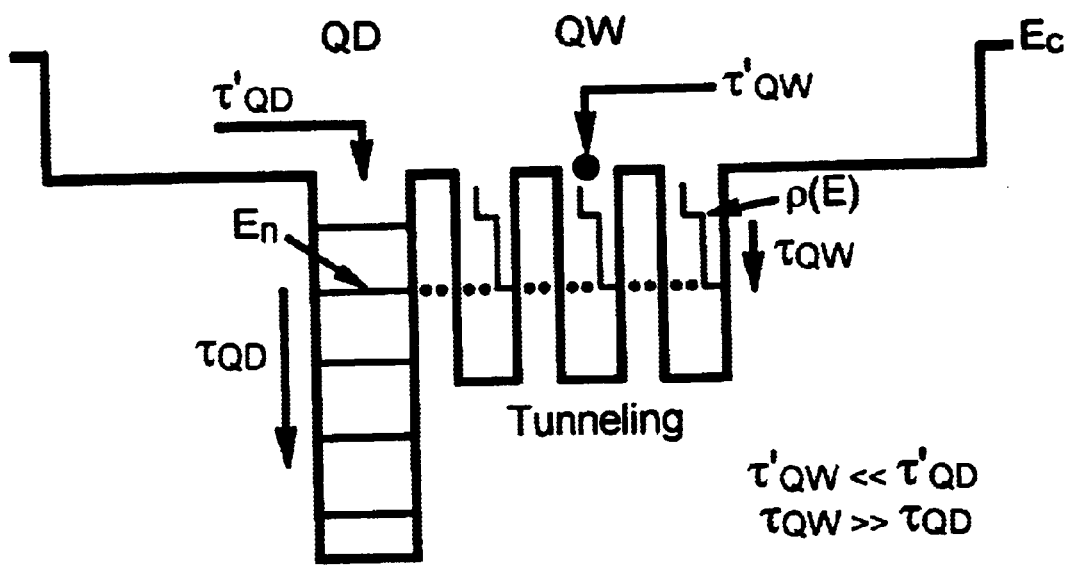
FIG. 13 is an energy diagram for another embodiment of the invention.

FIG. 13 is an energy diagram for a further embodiment of the invention which is seen to employ several quantum wells, which can be used to raise the well state energy. In this manner, higher energy states of the quantum dot layer(s) can be coupled with the multiple wells. This can advantageously permit spectral selection of the output optical radiation.

What is claimed is:

1. A method of forming a semiconductor device, comprising the steps of:
   providing a plurality of semiconductor layers;
   providing a means for coupling signals to and/or from layers of said device;
   providing a quantum well disposed between adjacent layers of said device; and
   providing a layer of quantum dots disposed in one of said adjacent layers, and spaced from said quantum well, whereby carriers tunnel in either direction between said quantum well and said quantum dots.

2. The method as defined by claim 1, wherein said step of providing a plurality of semiconductor layers comprises providing layers of III-V semiconductor.

3. The method as defined by claim 1, wherein the steps of providing a quantum well layer and a quantum dot layer comprises providing said layers as III-V semiconductor.

4. The method as defined by claim 2, wherein the steps of providing a quantum well layer and a quantum dot layer comprises providing said layers as III-V semiconductor.

5. The method as defined by claim 4, wherein said quantum dot layer is spaced from said quantum well layer by a barrier layer of III-V semiconductor, and wherein said barrier layer has a thickness in the range about 5 Angstroms to 100 Angstroms.

6. The method as defined by claim 1, wherein said step of providing a layer of quantum dots comprises provided undoped quantum dots.

7. The method as defined by claim 1, wherein said step of providing a layer of quantum dots comprises provided quantum dots doped n-type.

8. The method as defined by claim 4, wherein said step of providing a layer of quantum dots comprises provided quantum dots doped n-type.

9. The method as defined by claim 1, wherein said step of providing a layer of quantum dots comprises provided quantum dots doped p-type.

10. The method as defined by claim 4, wherein said step of providing a layer of quantum dots comprises provided quantum dots doped p-type.

11. The method as defined by claim 8, wherein said step of providing dots doped n-type comprises providing dots doped to a concentration of at least $N=10^{15}/cm^3$.

12. The method as defined by claim 10, wherein said step of providing dots doped p-type comprises providing dots doped to a concentration of at least $N=10^{16}/cm^3$.

13. The method as defined by any of claim 1, wherein said step of providing dots comprises providing dots having an average size in the range 10 to 100 Angstroms height and 10 to 200 Angstroms diameter.

14. The method as defined by any of claim 4, wherein said step of providing dots comprises providing dots having an average size in the range 10 to 100 Angstroms height and 10 to 200 Angstroms diameter.

15. The method as defined by any of claim 1, wherein said step of providing dots comprises providing dots having an average density in the range $10^{10}$ to $10^{12}$ per $cm^2$.

16. The method as defined by any of claim 4, wherein said step of providing dots comprises providing dots having an average density in the range $10^{10}$ to $10^{12}$ per $cm^2$.

17. The method as defined by any of claim 14, wherein said step of providing dots comprises providing dots having an average density in the range $10^{10}$ to $10^{12}$ per $cm^2$.

18. The method as defined by claim 1, wherein said method of forming a semiconductor device comprises a method of forming a semiconductor light emitter.

19. The method as defined by claim 4, wherein said method of forming a semiconductor device comprises a method of forming a semiconductor light emitter.

20. The method as defined by claim 4, wherein said method of forming a semiconductor device comprises a method of forming a semiconductor laser.

21. The method as defined by claim 4, wherein said method of forming a semiconductor device comprises a method of forming a transistor.

22. The method as defined by claim 4, wherein said method of forming a semiconductor device comprises a method of forming a field effect transistor.

23. The method as defined by claim 4, wherein said method of forming a semiconductor device comprises a method of forming a semiconductor detector.

24. The method as defined by claim 1, wherein said step of providing a quantum well further comprises providing a plurality of quantum wells.

25. The method as defined by claim 4, wherein said step of providing a quantum well further comprises providing a plurality of quantum wells.

26. The method as defined by claim 1, wherein said step of providing a layer of quantum dots further comprises providing a plurality of layers of quantum dots.

27. The method as defined by claim 4, wherein said step of providing a layer of quantum dots further comprises providing a plurality of layers of quantum dots.

28. The method as defined by claim 25, wherein said step of providing a layer of quantum dots further comprises providing a plurality of layers of quantum dots.

29. A method of forming a semiconductor device, comprising the steps of:
   providing a plurality of III-V semiconductor layers;
   providing a means for coupling signals to and/or from layers of said device; and
   providing a layer of doped quantum dots disposed in at least one of said layers as a source of carriers that communicate in either direction between said dots and another layer.

30. The method as defined by claim 29, wherein said step of providing a layer of doped quantum dots comprises providing a layer of III-V semiconductor quantum dots.

31. The method as defined by claim 30, wherein said step of providing a layer of doped quantum dots comprises providing dots that are lattice matched in the at least one semiconductor layer in which they are disposed.

32. The method as defined by claim 30, wherein said step of providing a layer of doped quantum dots comprises providing dots that are not lattice matched in the at least one semiconductor layer in which they are disposed.

33. The method as defined by claim 30, wherein said step of providing a layer of quantum dots comprises provided quantum dots doped n-type.

34. The method as defined by claim 30, wherein said step of providing a layer of quantum dots comprises provided quantum dots doped p-type.

35. The method as defined by claim 33, wherein said step of providing dots doped n-type comprises providing dots doped to a concentration of at least $N=10^{15}/cm^3$.

36. The method as defined by claim 34, wherein said step of providing dots doped p-type comprises providing dots doped to a concentration of at least $N=10^{16}/cm^3$.

37. The method as defined by claim 30, wherein said step of providing dots comprises providing dots having an average size in the range 10 to 100 Angstroms height and 10 to 200 Angstroms diameter.

38. The method as defined by claim 30, wherein said step of providing dots comprises providing dots having an average density in the range $10^{10}$ to $10^{12}$ per $cm^2$.

39. The method as defined by claim 37, wherein said step of providing dots comprises providing dots having an average density in the range $10^{10}$ to $10^{12}$ per $cm^2$.

* * * * *